United States Patent [19]

Sacks et al.

[11] Patent Number: 5,283,444
[45] Date of Patent: Feb. 1, 1994

[54] INCREASED WELL DEPTH HACT USING A STRAINED LAYER SUPERLATTICE

[75] Inventors: Robert N. Sacks; Thomas W. Grudkowski, both of Glastonbury; Donald E. Cullen, Manchester; William J. Tanski, Glastonbury, all of Conn.

[73] Assignee: United Technologies Corporation, Hartford, Conn.

[21] Appl. No.: 918,830

[22] Filed: Jul. 24, 1992

[51] Int. Cl.$^5$ .................. H01L 29/161; H01L 29/205
[52] U.S. Cl. ........................................ 257/18; 257/21; 257/22; 257/254; 257/416; 359/285; 359/305
[58] Field of Search ................ 257/12, 14, 15, 17, 257/18, 25, 26, 416, 21, 22, 254; 359/285, 305

[56] References Cited

U.S. PATENT DOCUMENTS

| | | | |
|---|---|---|---|
| 4,893,161 | 1/1990 | Tanski et al. | 257/14 |
| 5,155,738 | 10/1992 | Ijichi et al. | 257/18 |
| 5,166,766 | 11/1992 | Grudkowski et al. | 257/415 |

OTHER PUBLICATIONS

T. G. Andersson et al., "Variation of the Critical Layer Thickness with in Content in Strained In$_x$Ga$_{1-x}$-As–GaAs Quantum Wells by Molecular Beam Expitaxy" *Appl Physics Letters*, vol. 51, No. 10 (Sep. 7, 1987), pp. 752-754.

G. C. Osbourn et al., "Principal and Applications of Semiconductor Strained Layer Superlattices" in R. Dingle; *Semiconductors and Semimetals* (New York, Academic Press, 1987) vol. 24, Ch. 8, pp. 459-503.

H. C. Esaki, "Compositional Superlatices" in: E. H. C. Parker, *The Technology and Physics of Molecular Beam Epitaxy* (New York, Plenum Press, Ch 6, pp. 143-184, 1985.

Primary Examiner—William Mintel
Assistant Examiner—Minhloan Tran
Attorney, Agent, or Firm—Gerald L. Depardo

[57] ABSTRACT

A heterojunction acoustic charge transport device (HACT) having a charge transport channel 39 which is sandwiched between upper and lower charge confinement layers, 14,20, has the charge transport channel 39 made of a Strained Layer Superlattice (SLS) comprising alternating deep-well semiconductor layers 40, that provide a deep quantum well depth, and strain relief layers 42 that provide strain relief to prevent dislocations from occurring due to lattice mismatches between the InGaAs layers within the channel 39 and the charge confinement layers 14,20, thereby allowing the overall thickness of the channel 39 to be at least as wide as conventional HACT devices that use a GaAs channel. The strain relief layers 42 may be narrowly sized to allow tunneling of electrons across the entire channel 39 thereby allowing the charge to move as a single group, or alternatively, widely sized to provide separate isolated channels thereby allowing the charge to move in separate groups. Both embodiments provide increased quantum well depth in the channel 39 over conventional HACT devices.

6 Claims, 2 Drawing Sheets

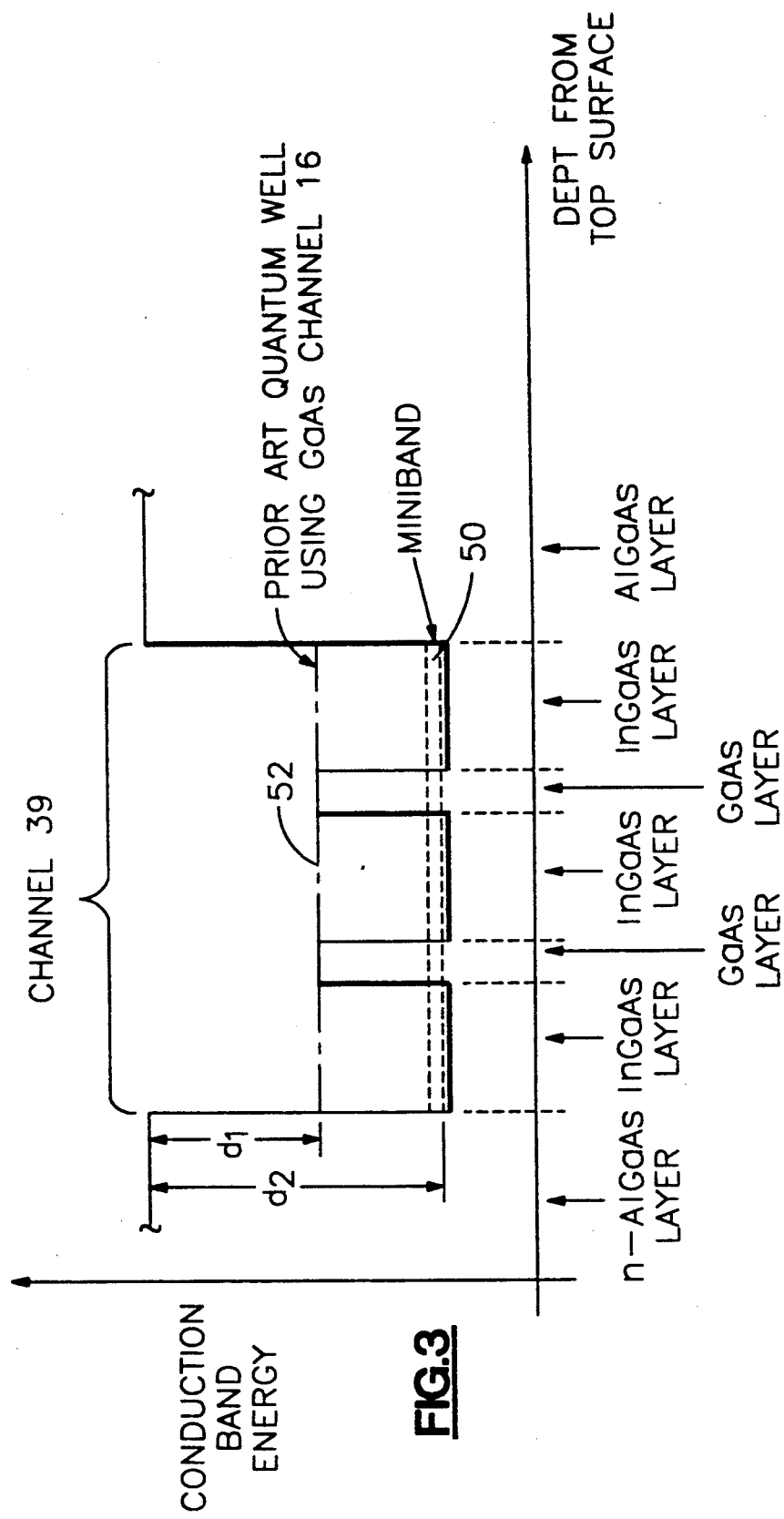

INCREASED WELL DEPTH HACT USING A STRAINED LAYER SUPERLATTICE

DESCRIPTION

1. Technical Field

This invention relates to Heterojunction Acoustic Charge Transport (HACT) devices and more particularly to increased charge capacity and well depth of the HACT.

2. Background Art

It is known in the art that a heterojunction acoustic charge transport (HACT) device comprises a HACT channel made of a first semiconductor material, e.g., Gallium Arsenide (GaAs), having a first conduction band energy, sandwiched between charge confinement layers made of a second semiconductor material, e.g., Aluminum Gallium Arsenide (AlGaAs), having a second conduction band energy higher than the first conduction band energy of the charge transport layer. The decrease in conduction band energy from the charge confinement layers to the charge transport layer is called a quantum well, as is known. All these layers are typically grown above a piezoelectric semiconductor substrate, such as GaAs. A surface acoustic wave (SAW) is injected into the material (typically by an interdigital transducer disposed on an upper surface of the HACT device) and propagates therein. Also, charge is injected into the HACT channel and is carried along the channel, in groups of charge called "charge packets", by an electric field generated by the SAW. Such a HACT device is described in U.S. Pat. No. 4,893,161, entitled "Quantum-Well Acoustic Charge Transport Device" to Tanski et al.

HACT devices have yet to be optimized for performance characteristics such as input signal level, dynamic range, noise figure and linearity. One approach to improving some or all of these performance characteristics is to increase the depth of the quantum well between the charge transport layer and the surrounding charge confinement layers, i.e., increase the difference in the conduction band energy between the charge confinement layers and the charge transport layer, thereby improving the confinement of the charge packets by reducing charge leakage out of the charge transport channel and also increasing the maximum charge capacity of the charge packets transported by the SAW, i.e., the amount of charge within a given charge packet.

Either or both of these effects, i.e., increased well depth or increased charge capacity, will increase signal-to-noise ratio and the dynamic range of the HACT device and likely have beneficial effects on other performance characteristics.

Present HACT devices use a single charge transport layer of GaAs having a thickness of 400–600 Å sandwiched between two charge confinement layers of AlGaAs with an Al content of approximately 30%. Because GaAs and AlGaAs are effectively lattice matched to within about 0.1%, the problem of lattice mismatch does not occur with a GaAs channel and AlGaAs charge confinement layers.

However, changing the charge transport channel from GaAs to another material with a lower conduction band energy, such as Indium Gallium Arsenide (InGaAs), has the inherent problem of lattice mismatches between the channel and the surrounding charge confinement layers.

In the growth of a lattice-mismatched epitaxial layer of InGaAs on GaAs or AlGaAs (GaAs and AlGaAs being effectively lattice matched), good quality layers may be achieved if the total In content is below a critical value defined by a nonlinear monotonic inverse relationship between % In content and In layer thickness, as described in T. G. Anderson, "Variation of the Critical Layer Thickness with In Content in Strained $In_xGa_{1-x}As$-GaAs Quantum Wells Grown by Molecular Beam Epitaxy", *Applied Physics Letters*. Vol. 51, No. 10 (Sept 1987) pp 752–754. Above this critical value, crystal imperfections known as dislocations begin to form which degrade charge transportation within the HACT device. Thus, for a given % In content there is a unique In layer thickness corresponding to the maximum thickness for no crystal dislocations to occur. As the % In content is increased, the critical In layer thickness must be decreased (by a different amount) to prevent dislocations. Similarly, as the In layer thickness is increased, the critical % In content must be decreased (by a different amount). For example, for a % In content of 15%, the critical In layer thickness is about 200 Å to prevent crystal dislocations, and for a % In content of 25%, the critical In layer thickness is about 150 Å. For a charge transport channel thickness of 500 Å, comparable to current HACT devices, the minimum % In content needed to prevent crystal dislocations would be 8%.

As is known, the depth of the quantum well is related to the % In content. Consequently, an InGaAs charge transport channel with an % In content less than 10% creates a well depth that is not sufficiently deeper than that of a GaAs channel, and thus does not provide an appreciable improvement in HACT performance.

Therefore, it would be desirable to achieve the charge transport channel thickness of 400–600 Å made of a material having a larger well depth than GaAs (i.e., without reducing the content of such material below an acceptable level), thereby improving the aforementioned performance characteristics.

DISCLOSURE OF INVENTION

Objects of the invention include provision of a heterojunction acoustic charge transport (HACT) device which has increased well depth and/or which has increased charge capacity over conventional HACT devices.

According to the present invention, a HACT device comprises a charge transport layer (or channel) sandwiched between an a pair of charge confinement layers. Charge packets are transported by a SAW along the charge transport channel. The charge transport channel comprises a strained layer superlattice comprising alternating layers of deep-well semiconductor layers not being lattice matched to the charge confinement layers and having a conduction band energy below that of the charge confinement layers, and strain relief layers being substantially lattice matched to the charge confinement layers and having a thickness so as to provide strain relief of the lattice mismatch thereby preventing formation of crystal dislocations.

According further to the invention, the deep-well semiconductor is InGaAs. In further accord to the invention the strain relief semiconductor is GaAs.

Further according to the invention, the thickness of the strain relief layers are set so as to allow tunneling of charge within the charge packets across the strain relief layers, thereby allowing the charge to propagate along the channel as a single group. Still further according to the invention, the thickness of the strain relief layers are set so as to not allow tunneling of charge, thereby providing separate isolated channels for charge to propagate in separate groups.

The invention provides a significant improvement over prior art HACT devices because the charge transport channel comprises a material that is lattice mismatched and has a deep quantum well, thereby allowing increased well depth over conventional HACT devices and, consequently, decreased charge leakage out of the channel and increasing charge capacity. Also, the invention provides tunneling action across the strain relief layers to allow the charge to propagate along the channel in a single group, i.e., provide coupled quantum wells. Alternatively, the invention allows for multiple isolated channels within the channel.

The foregoing and other objects, features and advantages of the present invention will become more apparent in light of the following detailed description of exemplary embodiments thereof as illustrated in the accompanying drawings.

BRIEF DESCRIPTION OF DRAWINGS

FIG. 3 is a graph of the conduction band energy level versus the depth into the HACT device showing a conduction band energy for upper and lower confinement layers and the strained layer superlattice charge transport channel, in accordance with the present invention.

BEST MODE FOR CARRYING OUT THE INVENTION

Figure 1:
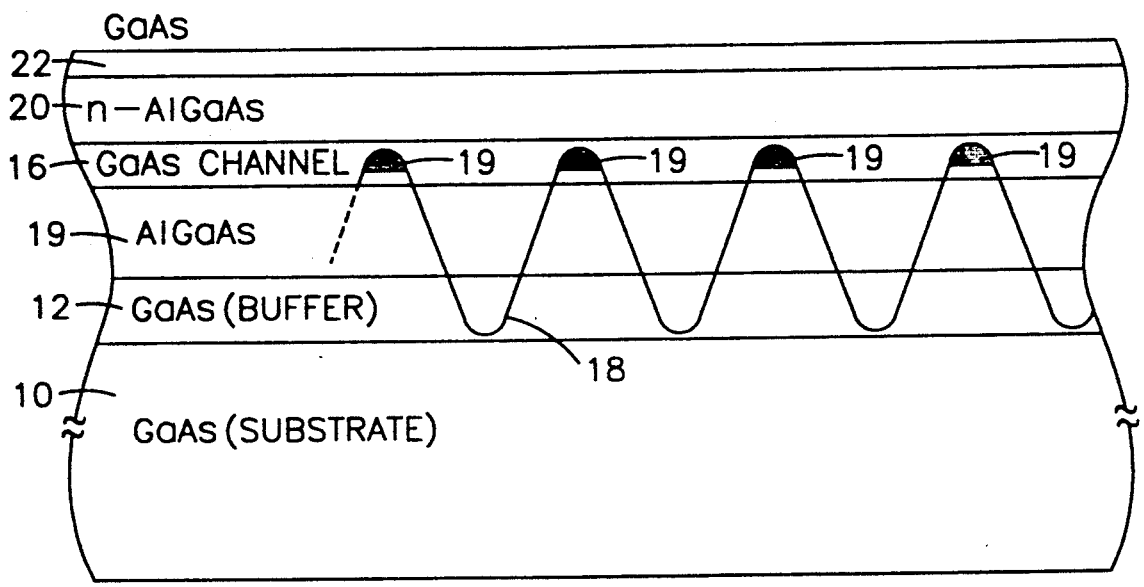
FIG. 1 is a cross sectional view of the layer of a prior art HACT device.

Referring to FIG. 1, a prior art HACT device similar to that described in the aforementioned U.S. Pat. No. 4,895,161 to Tanski et al, comprises a substrate 10 made of GaAs having a thickness of approximately 500 microns. Grown above the substrate 10 is a buffer layer 12 of GaAs having a thickness of approximately 1000 to 9000 Å, which is grown, as is known, to provide clean GaAs material to grow the remaining layers from. Grown above the buffer layer 12 is a lower charge confinement layer 14 made of AlGaAs having a concentration of aluminum (Al) of about 30%, being not intentionally doped (NID), and having a thickness of approximately 1100 Å.

Above the lower charge confinement layer 14, is a charge transport layer 16 made of NID GaAs, having a thickness of approximately 400–600 Å. The charge transport layer 16 is also called a charge transport channel because the layer 16 acts as a conduit (or channel) for propagating electrons without having electrons leak into other layers of the device (due to the difference in conduction band energy creating a quantum well, as discussed hereinbefore).

A surface acoustic wave (SAW) 18 is launched into and propagates through the HACT device, as disclosed hereinbefore, and carries charge packets 19 (a group of electrons) along the charge transport channel 16. Above the charge transport channel 16 is an upper charge confinement layer 20 made of AlGaAs having an Al concentration of about 32% and being N-doped with a concentration of approximately $2 \times 10^{17}/cm^3$ and having a thickness of about 700 Å. Above the upper charge confinement layer 20, is a cap layer 22 made of NID GaAs having a thickness of approximately 200 Å. Other thicknesses of the layers 10–16, 20, 22 may be used if desired. Also, other concentrations of Al may be used if desired, as is known.

Figure 2:
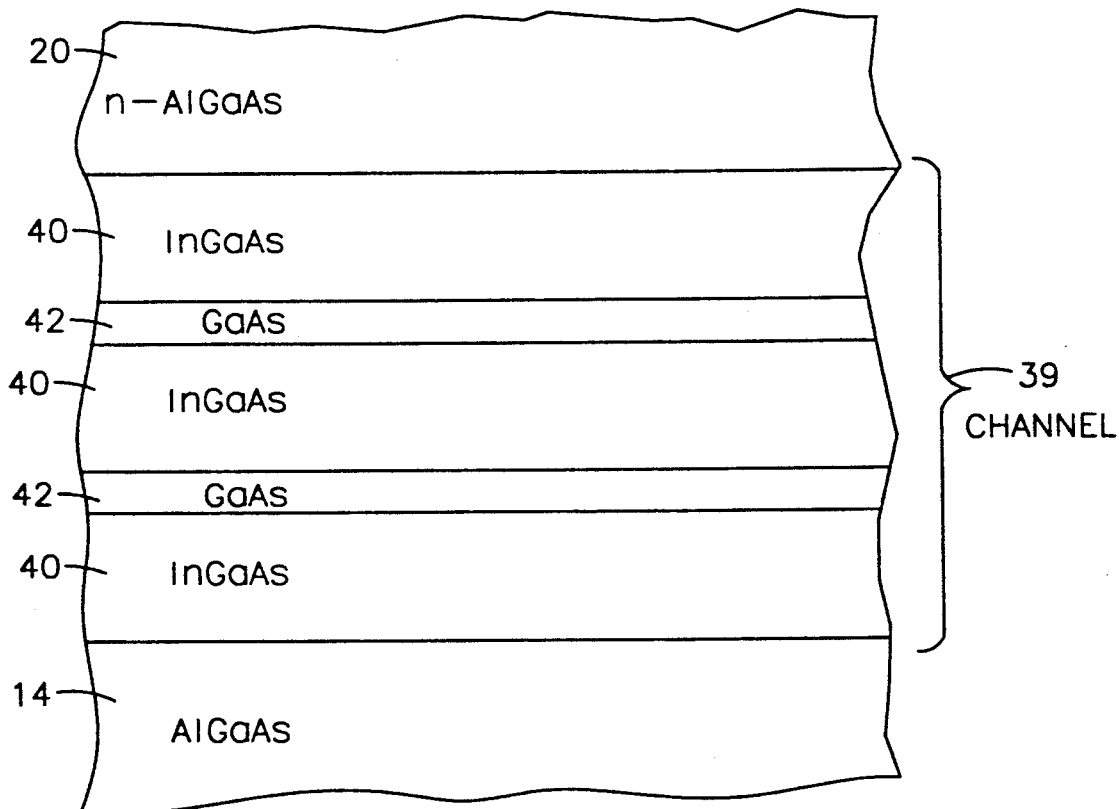
FIG. 2 is a cross sectional view of the layers a strained layer superlattice charge transport channel of a HACT device, having alternating layers of two different semiconductors, in accordance with the present invention.

Referring now to FIG. 2, a charge transport channel 39 in accordance with the present invention comprises a "Strained Layer Superlattice" comprising alternating layers of a first semiconductor 40, e.g., $In_{.25}Ga_{.75}As$ (or $(In_{.25},Ga_{.75})As$ or $In_xGa_{1-x}As$ where $x=0.25$), having a thickness of approximately 150 Å and 25% In content and a second semiconductor 42, e.g., GaAs, having a thickness of approximately 50 Å. Thus, the channel comprises 2.5 periods of $In_{.25}Ga_{.75}As/GaAs$ pairs of layers.

A "Strained Layer Multiple Quantum Well" or "Strained Layer Superlattice" (SLS) is defined as multiple layers of two or more different semiconductors, one of which is not lattice matched to the adjacent layers but where the strain caused by the lattice mismatch is taken-up by tetragonal deformation (i.e., stretching) rather than forming dislocations (i.e., misalignment of adjacent atoms). For a general discussion of strained layer superlattices, see G. C. Osbourn et al, "Semi-conductors and Semimetals", *Academic Press*, Vol. 24, Ch 8, (1987) pp 459–503.

The allowable % In content is increased substantially by the use of a strained layer superlattice composed of alternating layers of (In,Ga)As/GaAs where the GaAs acts both as a strain relief layer and as an energy barrier. For example, to achieve a channel thickness of 500 Å without an SLS, the % In content must be no more than 8% to prevent dislocations (as discussed hereinbefore). However with a superlattice, 2.5 periods of 150 Å thick (In,Ga)As and 50 Å thick GaAs may be used as the channel 39, as shown in FIG. 2. This would give a total (In,Ga)As amount of 450 Å and an overall charge transport layer thickness of 550 Å. Other thicknesses for the InGaAs layers may be used if desired. However, the thickness of the GaAs layers must be greater than approximately 20–30 Å for the GaAs layers 42 to provide adequate strain relief of the lattice mismatch between AlGaAs and InGaAs and thereby prevent dislocations from occurring.

Referring now to FIG. 3, if the thickness of each GaAs layer 42 is less than about 70 Å, the electrons in the (In,Ga)As quantum well layers 40 will tunnel through the GaAs layers 42 or (barriers) and form a "miniband" 50 or "mini zone", as discussed in E. H. C. Parker, "The Technology and Physics of Molecular Beam Epitaxy", *Plenum Press*. Ch6, pp 143–184. The formation of minibands due to tunneling creates a lowest allowed energy level d2 that is common across the entire superlattice channel 39 and the quantum wells created by the InGaAs layers 40 behave as a group, i.e., they are coupled quantum wells.

Thus, when tunneling occurs, electrons act as a single entity rather than forming individual groups confined to each quantum well within a given charge packet. Consequently, the electrons spend most of their time in the InGaAs layers 40 and can somewhat freely tunnel vertically (FIG. 2) from one InGaAs layer 40 to another through the energy barriers of the GaAs layers 42. It should be understood that the charges still travel in (and are confined to) charge packets longitudinally (horizontally; FIGS. 1, 2) whether or not tunneling occurs.

The energy depth d1 of the prior art charge transport channel 16 (FIG. 1) quantum well 52 (FIG. 3) is about 0.27 eV (electron volts). The extra energy depth of the quantum well obtained by using $In_{0.25}Ga_{.75}As$ as opposed to GaAs for the charge transport layer is about 0.21 eV. However, this extra depth is reduced by about 0.02 eV to about 0.19 eV due to quantization effects of the GaAs layers 42 for a 150 Å thick quantum well. But this small reduction would be mitigated somewhat by miniband 50 formation due to tunneling through the thin GaAs barriers. Thus, the total effective quantum well depth d2 for the entire superlattice channel 39 is about 0.46 eV (0.27 eV + 0.19 eV), which is a substantial (about 75%) increase over the 0.27 eV well depth obtained for the (Al,Ga)As/GaAs heterojunction in the standard HACT device.

As an alternative embodiment, it is possible to use a strained layer superlattice to provide multiple isolated quantum wells for multiple isolated charge carrying capability. In that case, the thickness of the GaAs strain relief layer would be greater than 70 Å, e.g., 100 Å. Also, it should be understood that the lowest energy level in an isolated channel case is greater than the common lowest energy level realized when tunneling occurs.

Also, it is known that quantum well depth is related to charge capacity of the channel. Thus, in addition to decreasing charge leakage out of the channel, the increased well depth of the invention also increases the charge capacity of the channel. Consequently, for either embodiment (i.e., the tunneling effect or the multiple isolated channels), use of such a strained layer superlattice for the charge transport channel 39 of a HACT device gives greater overall quantum well depth and likely greater charge capacity than a channel made from GaAs or a single layer of $(In_{.08},Ga_{.92})As$. Also, the invention provides more charge capacity than a channel made from a single layer of $In_{.25}Ga_{.75}As$.

Furthermore, using a strained layer superlattice has no effect on the sensing or removal of the charge packets by taps on the surface of the HACT.

Also, we have found that whenever (In,Ga)As is used as the charge transport layer, GaAs should be used as the strain relief layer instead of AlGaAs because high quality (In,Ga)As and GaAs can both be grown at the same temperature, e.g., 540 deg C, which is lower than the optimum temperature for growing (Al,Ga)As. Also, because the layers 42 between the (In,Ga)As layers 40 are very thin, e.g., 50 Å, it is not practical to run the temperature up and down during the growing process, but is best to grow all the layers in the strained layer superlattice channel 39 at the same temperature.

Although the invention has been described using 2.5 periods of (In,Ga)As/GaAs within the superlattice, it should be understood by those skilled in the art that the invention will work equally well with more or less than 2.5 periods, provided you alternate the strain relief layers with the deep-well (lattice mismatched) layers. However, there is a maximum thickness where dislocations will occur even when strain relief layers are used. Also, it is not required that the SLS begin and end with a lattice mismatched deep-well semiconductor material (i.e., InGaAs) nor that it begin and end with the same type of semiconductor material.

It should be understood by those skilled in the art that electrons or holes or both may be used as the mobile charge carriers within the charge packets carried by the SAW.

Even though the invention has been described with a substrate contiguous with the superlattice channel and the charge confinement layers, the HACT substrate, from which the superlattice and the other layers are grown, may be removed and the remaining layers placed adjacent to a highly piezoelectric medium, such as Lithium Niobate ($LiNbO_3$), or any other material that exhibits highly piezoelectric properties, as described in U.S. Pat. No. 4,990,814, entitled "Separated Substrate Acoustic Charge Transport Device", to Tanski et al.

Similarly, the strained layer superlattice channel of the present invention may be used in a HACT Spatial Light Modulator (SLM), such as that described in co-pending U.S. patent applications: Ser. No. 07/778,043 entitled "Thick Transparent Epitaxial Layer Heterojunction Acoustic Charge Transport Multiple Quantum Well Spatial Light Modulator"; Ser. No. 07/777,883 entitled "Dual Medium Heterojunction Acoustic Charge Transport Multiple Quantum Well Spatial Light Modulator"; and Ser. No. 07/777,884 entitled "Thick Transparent Semiconductor Substrate Heterojunction Acoustic Charge Transport Multiple Quantum Well Spatial Light Modulator".

Also, the invention may be used in a HACT device that employs a plurality of channels such as that described in the aforementioned patent to Tanski et al, at Col. 3 lines 56 to 61, and Col. 4 lines 1 to 2. The Tanski et al patent discusses using multiple channels (quantum wells) to increase the charge capacity of the HACT device using (Al,Ga)As as intermediate (spacer) layers between GaAs charge transport layers. In that case, each of the multiple channels may be an SLS like that of the present invention.

Although the invention has been described and illustrated with respect to the exemplary embodiments thereof, it should be understood by those skilled in the art that the foregoing and various other changes, omissions and additions may be made without departing from the spirit and scope of the invention.

We claim:

1. A heterojunction acoustic charge transport device having a surface acoustic wave (SAW) propagating therein and having charge packets being carried by the SAW, comprising:

a piezoelectric substrate;

a pair of charge confinement layers of semiconductor material disposed near said substrate, having a confinement conduction band energy, for confining said charge packets therebetween;

a charge transport layer comprising a strained layer superlattice of at least two different semiconductor material disposed between and contiguous with said pair of charge confinement layers to provide increased well-depth thereby decreasing charge leakage out of said charge transport channel and increasing charge capacity of said charge transport channel; and said strained layer superlattice comprising:

a plurality of deep-well semiconductor layers not lattice matched to said charge confinement layers and having a deep-well conduction band energy lower than said confinement conduction band energy; and a plurality of strain relief semiconductor layers, disposed contiguous with and in alternation with said plurality of deep-well semiconductor layers, substantially lattice matched to said charge confinement layers, each strain relief layer being thick enough to provide strain relief, thereby preventing the formation of crystal dislocations caused by said deep-well semiconductor layers not being lattice matched to said charge confinement layers.

2. The heterojunction acoustic charge transport device according to claim 1, wherein said substrate comprises GaAs and said pair of charge confinement layers comprise AlGaAs.

3. The heterojunction acoustic charge transport device according to claim 1, wherein said plurality of deep-well semiconductor layers comprises InGaAs.

4. The heterojunction acoustic charge transport device according to claim 1, wherein said plurality of strain relief layers comprises GaAs.

5. The heterojunction acoustic charge transport device according to claim 1, wherein said strain relief layers each have a thickness so as to allow tunneling of the charge carried by the charge packets across said strain relief layers.

6. The heterojunction acoustic charge transport device according to claim 1, wherein said strain relief layers each have a thickness so as to provide separate isolated channels of charge transportation.

* * * * *